(12) United States Patent
Iwasaki

(10) Patent No.: US 8,035,796 B2
(45) Date of Patent: Oct. 11, 2011

(54) IMMERSION EXPOSURE APPARATUS AND DEVICE MANUFACTURING METHOD

(75) Inventor: Yuichi Iwasaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 635 days.

(21) Appl. No.: 12/133,206

(22) Filed: Jun. 4, 2008

(65) Prior Publication Data

US 2009/0002649 A1    Jan. 1, 2009

(30) Foreign Application Priority Data

Jun. 27, 2007  (JP) ................................. 2007-168525

(51) Int. Cl.
*G03B 27/52* (2006.01)
*G03B 27/42* (2006.01)
*G03B 27/58* (2006.01)

(52) U.S. Cl. ................ 355/30; 355/53; 355/72

(58) Field of Classification Search .......... 355/30, 355/53, 55, 72–74, 77; 430/30, 311, 312, 430/328, 330; 250/492.1, 492.2, 492.22, 250/548

See application file for complete search history.

(56) References Cited

U.S. PATENT DOCUMENTS

| | | | |
|---|---|---|---|
| 5,121,256 A | 6/1992 | Corle | |
| 5,212,050 A * | 5/1993 | Mier et al. | 430/320 |
| 6,195,156 B1 * | 2/2001 | Miyamoto et al. | 355/85 |
| 6,841,789 B2 * | 1/2005 | Koh et al. | 250/492.3 |
| 7,242,455 B2 | 7/2007 | Nei | |
| 2005/0053850 A1 * | 3/2005 | Askebjer et al. | 430/5 |
| 2005/0219489 A1 * | 10/2005 | Nei et al. | 355/53 |
| 2005/0264774 A1 | 12/2005 | Mizutani | |
| 2006/0126043 A1 | 6/2006 | Mizutani | |
| 2006/0126044 A1 | 6/2006 | Mizutani | |
| 2006/0152699 A1 | 7/2006 | Nei | |
| 2006/0250596 A1 | 11/2006 | Nei | |

(Continued)

FOREIGN PATENT DOCUMENTS

JP    2000-326558 A    11/2000

(Continued)

OTHER PUBLICATIONS

Masahiro Miyauchi; Nobuo Kieda; Shunichi Hishita; Takefumi Mitsuhashi; Akira Nakajima; Toshiya Watanabe; Kazuhito Hashimoto; "Reversible wettability control of TiO2 surface by light irradiation"; Surface Science; 511; pp. 401-407; 2002.

*Primary Examiner* — Peter B Kim
*Assistant Examiner* — Christina Riddle
(74) *Attorney, Agent, or Firm* — Canon USA Inc IP Division

(57) ABSTRACT

An immersion exposure apparatus which exposes a substrate through a liquid includes an illumination optical system, a projection optical system, a chuck, a liquid support plate, a stage, and a liquid repellency recovery unit. The illumination optical system illuminates an original with exposure light from exposure light sources. The projection optical system projects a pattern of the original onto the substrate. The chuck holds the substrate. The liquid support plate supports a liquid together with the substrate held by the chuck. A surface of the liquid support plate includes a surface of a metal oxide. The stage is provided with a chuck and the liquid support plate and is movable. The liquid repellency recovery unit is configured to recover the liquid repellency of the surface of the metal oxide with regard to the liquid.

5 Claims, 8 Drawing Sheets

U.S. PATENT DOCUMENTS

| | | |
|---|---|---|
| 2007/0035711 A1 | 2/2007 | Nei |
| 2007/0147832 A1 | 6/2007 | Shigemori |
| 2007/0182945 A1* | 8/2007 | Shibuta .......................... 355/53 |
| 2007/0242242 A1* | 10/2007 | Nagasaka et al. ................ 355/53 |
| 2007/0258072 A1 | 11/2007 | Nagasaka |
| 2008/0002163 A1* | 1/2008 | Fujiwara et al. ................ 355/30 |
| 2008/0117401 A1* | 5/2008 | Tani ................................ 355/67 |
| 2008/0137047 A1* | 6/2008 | Mizutani et al. ................ 355/30 |
| 2008/0316441 A1* | 12/2008 | Liebregts et al. ............... 355/30 |

FOREIGN PATENT DOCUMENTS

| | | |
|---|---|---|
| JP | 2004-207696 A | 7/2004 |
| JP | 2004-207710 A | 7/2004 |
| WO | 99/49504 | 9/1999 |

* cited by examiner

IMMERSION EXPOSURE APPARATUS AND DEVICE MANUFACTURING METHOD

BACKGROUND OF THE INVENTION

1. Field of the Invention

The present invention relates to an immersion exposure apparatus for exposing a substrate through a liquid and a device manufacturing method using the same.

2. Description of the Related Art

A projection exposure apparatus which exposes a substrate such as a wafer with a circuit pattern drawn on an original such as a reticle (mask) by a projection optical system has conventionally been used. Recently, there is an increasing demand for the exposure apparatus of high resolution and high quality. Under such a circumstance, attention is being directed to an immersion exposure method as one of ways for responding to such a demand for high resolution (U.S. Pat. No. 5,121,256). The immersion exposure method serves to increase further the numerical aperture (NA) of the projection optical system by placing a liquid as the medium at the wafer side of the projection optical system. When the refractive index of the medium is n, $NA = n \cdot \sin\theta$ is established. Accordingly, the NA of the projection optical system can be increased up to n if a part of the apparatus is filled with a medium of refractive index (n>1), which is higher than the refractive index of air. As a result, the resolution R ($R = k1(\lambda/NA)$) of the exposure apparatus represented by a process constant k1 and a wavelength $\lambda$ of a light source is raised.

A local fill type immersion exposure apparatus in which a space between a final lens of the projection optical system and a portion of a surface of the wafer is partially filled with liquid has been discussed in International Publication No. WO99/49504. In the local fill type immersion exposure apparatus, a wafer is exposed while being moved with respect to the projection optical system. Accordingly, bubbles or turbulent flow may be generated in the liquid between the projection optical system and the wafer. The bubbles shield exposing light and the turbulent flow applies a pressure to the final lens of the projection optical system to cause a minute deformation of the final lens, which results in an occurrence of aberration in the projection optical system. Therefore, in order to prevent a transfer property of the immersion exposure apparatus from deteriorating, it has been proposed that a portion of the projection optical system contacting the liquid is subjected to a surface treatment so as to allow the portion of the projection optical system contacting the liquid to have compatibility with the liquid.

Further, Japanese Patent Application Laid-Open No. 2004-207696 and Japanese Patent Application Laid-Open No. 2004-207710 discuss a liquid support plate designed to be substantially flush with the wafer and to be arranged around the wafer so that the liquid will not spill when a shot (edge shot) of a wafer end is exposed to light in the local fill type immersion exposure apparatus.

However, in the local fill type immersion exposure apparatus, there is a problem that a droplet may remain on the liquid support plate when the wafer is exposed to light while it is moved together with the liquid support plate. The remaining droplet may oxidize the liquid support plate which results in contamination of the wafer. Further, the droplet remaining on the liquid support plate may fly apart while the wafer and the liquid support plate are moved and cause contamination or corrosion of components around the residual droplet. Whether the liquid in the form of the droplet remains on the liquid support plate depends on the contact angle of the surface of the liquid support plate.

The above-described local fill type immersion exposure apparatus has the following problems.

If ultraviolet rays (exposure light) having a high energy such as a KrF laser or an ArF laser fall onto the surface of the liquid support plate while an immersion liquid (for example, purified water) attaches to the surface of the liquid support plate, surface conditions of ceramics such as SiC and Teflon® used as materials of the liquid support plate will change. Generally, the contact angle of the ceramics will be remarkably decreased. For example, in the case of SiC, the contact angle decreases from about 50 degrees before exposure to about 10 degrees after irradiation of the exposure light. Further, the surface of the resin will be shaved as the contact angle decreases.

The following problem will occur if the contact angle of the surface of the liquid support plate increases (i.e., if the liquid repellency lowers). If the contact angle of the liquid with respect to the surface of the liquid support plate is smaller than that of a resist (photosensitive resin) applied on the wafer, liquid may remain on the liquid support plate in the form of a droplet when the liquid film moves from the liquid support plate to the surface of the wafer. If the droplet remains on the liquid support plate, it may invite wafer contamination. Further, the residual droplet may fly apart while a stage is moving, which causes contamination or corrosion of components around the stage.

SUMMARY OF THE INVENTION

The present invention is directed to an immersion exposure apparatus which can reduce a droplet remaining on the liquid support plate.

According to an aspect of the present invention, an immersion exposure apparatus for exposing a substrate through a liquid includes an illumination optical system configured to illuminate an original with exposure light from an exposure light source, a projection optical system configured to project a pattern of the original onto the substrate, a chuck configured to hold the substrate, a liquid support plate configured to support the liquid together with the substrate held by the chuck, a movable stage including the chuck and the liquid support plate and a liquid repellency recovery unit configured to recover a liquid repellency of a surface of the liquid support plate with respect to the liquid, wherein the surface of the liquid support plate includes a surface of a metal oxide, and wherein the liquid repellency recovery unit recovers the liquid repellency of the surface of the metal oxide with respect to the liquid.

Further features and aspects of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to describe the principles of the invention.

DESCRIPTION OF THE EMBODIMENTS

Figure 1:
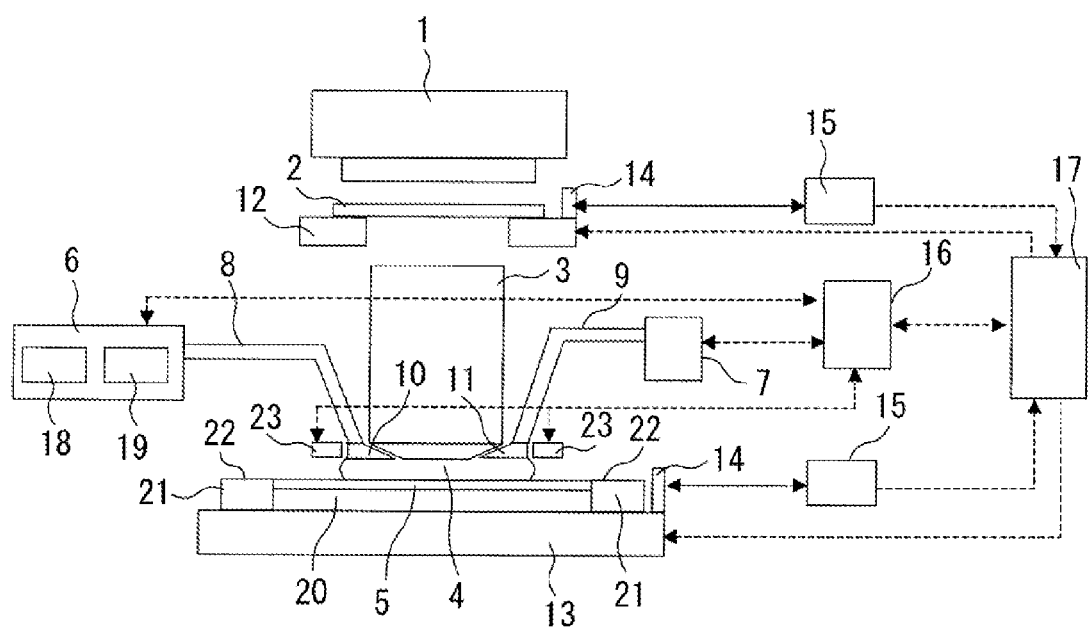
FIG. 1 illustrates an example configuration of an immersion exposure apparatus according to a first exemplary embodiment of the present invention.

Various exemplary embodiments, features, and aspects of the invention will be described in detail below with reference to the drawings.

In the immersion exposure apparatuses according to the present exemplary embodiments, a space is filled with a liquid (immersion liquid) between a substrate to be exposed and a final lens of an projection optical system that is the closest to the substrate, and the substrate is exposed to light through the projection optical system and the liquid. The immersion exposure apparatus includes a liquid supply device for supplying the liquid to the space between the final lens and the substrate. The immersion exposure apparatus further includes a liquid support plate which is arranged around the substrate and which holds the liquid together with the substrate. A surface of the liquid support plate includes a surface of a metal oxide. The immersion exposure apparatus further includes a liquid repellency recovery unit. As for the liquid repellency recovery unit, for example, a light source (irradiating light source) which irradiates with light (irradiating light) having a wavelength different from the exposure light may be used. The irradiating light from the irradiating light source falls onto the liquid support plate.

Here, the wavelength of the irradiating light emitted from the light source corresponds to an energy smaller than an energy which makes the metal oxide lyophilic. The irradiating light includes a wavelength of visible light and a wavelength longer than the visible light. Further, the original is, for example, a reticle, and the substrate to be exposed is, for example, a wafer.

In the above-described configuration, the immersion exposure apparatus is provided with a metal oxide on a surface of the liquid support plate and a light source for irradiating the metal oxide with light having a wavelength different from a wavelength of the exposure light. Accordingly, stability of the immersion exposure apparatus is improved and a residual droplet on the liquid support plate is reduced.

For example, titanium oxide, which is a kind of metal oxide, has about an 80 degree contact angle with water, which hardly causes a residual droplet. However, if the titanium oxide is subjected to ultraviolet rays equal to or larger than a band gap (3.2 eV) and absorbs light energy thereof, the contact angle becomes smaller, so that the titanium oxide loses water repellency. The exposure light such as a KrF laser or an ArF laser has an energy higher than the band gap energy of the titanium oxide. Accordingly, if the exposure light falls onto the metal oxide on the liquid support plate, the metal oxide loses the water repellency. However, the lost water repellency can be recovered by a liquid repellency recovery unit such as a light source which irradiates the metal oxide with light having a wavelength of visible light or a wavelength longer than the visible light.

The above-described characteristics of titanium oxide are discussed in, for example, "Masahiro Miyauchi; Nobuo Kieda; Shunichi Hishita; Takefumi Mitsuhashi; Akira Nakajima; Toshiya Watanabe; Kazuhito Hashimoto; "Reversible wettability control of TiO2 surface by light irradiation"; Surface Science; 511; pp. 401-407; 2002"

According to the exemplary embodiments, it is desirable that irradiation with the light by the irradiating light source is always performed after the exposure light falls at least once onto the metal oxide on the liquid support plate. In this manner, the droplet remaining on the liquid support plate can be further reduced.

As for the liquid repellency recovery unit, a heat source (heater) for heating titanium oxide(metal oxide) in which a liquid repellency is eliminated or decreased, or an air blower (fan) for blowing air onto titanium oxide (metal oxide) in which the liquid repellency is eliminated or decreased can also be used.

In the case of using the above liquid repellency recovery units, it is also desirable that heating or blowing is always performed after a certain amount of exposure light falls onto the metal oxide.

Exemplary Embodiments

An immersion exposure apparatus according to the following exemplary embodiments includes a projection optical system for exposure-transferring a pattern on a reticle onto a wafer, and a liquid supply device for supplying a liquid (immersion liquid) into a space between a final lens that is the closest to a wafer of the projection optical system and the wafer. The immersion exposure apparatus performs exposure while it holds the liquid at least in a portion of the space. Further, the liquid support plate including a surface having substantially the same height as a surface of the wafer is provided around a wafer chuck which holds the wafer. A surface of the liquid support plate is coated with metal oxide. Further, as the liquid repellency recovery unit, an irradiating light source is provided for emitting irradiating light having a wavelength different from the exposure light to the metal oxide on a surface of the liquid support plate.

As an example, an ArF laser is used as the exposure light and water (purified water) is used as the immersion liquid. However, the present invention is also applicable to an immersion exposure apparatus that uses instead of the ArF laser and water light having a different wavelength and an immersion liquid usable at this wavelength. Further, the immersion liquid may be a liquid containing water with a minute amount of an additive or a hydrocarbon organic liquid.

First Exemplary Embodiment

FIG. 1 illustrates an example configuration of an immersion exposure apparatus according to a first exemplary embodiment of the present invention. According to the first exemplary embodiment, the present invention is applied to a scanning type immersion exposure apparatus.

In FIG. 1, an illumination apparatus 1 irradiates a reticle (mask) 2 serving as an original with exposure light. The illumination apparatus 1 includes an ArF excimer laser (wavelength of 193 nm) as an exposure light source and an illumination optical system. A projection optical system 3, which is a refractive type or a catadioptric type, projects a circuit pattern of the reticle 2 irradiated by the illumination apparatus 1 onto a wafer 5 that is a substrate to be exposed. A laser interferometer 15 for measuring a distance measures a two-dimensional position of a reticle stage 12 or a wafer stage 13 within a level plane through a reference mirror 14. Based on the thus measured value, a stage control device 17 performs positioning and synchronization control of the reticle 2 and the wafer 5.

Further, the wafer stage 13 is arranged on a surface plate (not shown) and includes a chuck 20 for holding the wafer 5. The chuck 20 has a function to adjust a position, a rotation angle and an inclination of the wafer 5 in an up-and-down direction so that a surface of the wafer 5 is in conformity with an image plane of the projection optical system 3 in exposing the wafer 5. Furthermore, within a range where the exposure light falls when an edge shot of the wafer 5 on the wafer stage 13 is exposed to light, annular liquid support plates 21 are fixedly provided which has surfaces of a height identical to the surface of the wafer 5. Metal oxide films 22 are formed on the surfaces of the liquid support plates 21. The surfaces of the metal oxide films 22 (metal oxide surfaces) prevent a liquid film 4 from flowing over from the wafer 5 in exposing the edge shot of the wafer 5 to light.

Figure 2A:
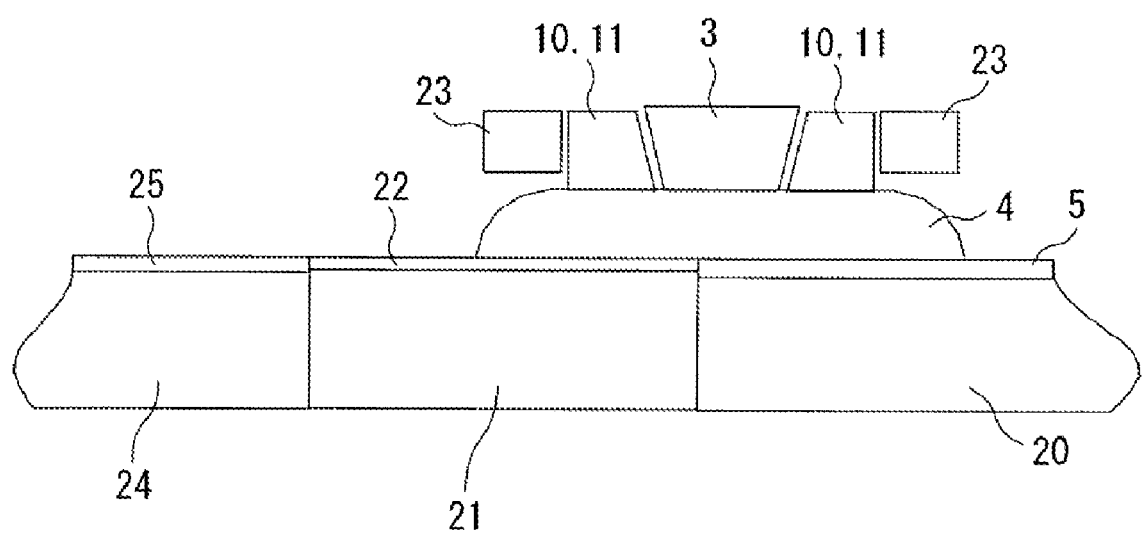
FIG. 2A illustrates a vicinity of a liquid film of the immersion exposure apparatus according to the first exemplary embodiment of the present invention.

In a range outside the liquid support plates 21 on the wafer stage 13 where the exposure light does not fall, liquid support plates 24 (see FIG. 2A) are fixedly provided which have water repellent films 25 (see FIG. 2A) on its surface at a height substantially identical to the surface of the wafer 5.

In the present exemplary embodiment, the metal oxide film 22 is made of $TiO_2$. However, any film may be used as the metal oxide film 22 as far as the film contains at least one of $TiO_2$, $ZnO$, $Cr_2O_3$, $HfO_2$, and $WO_3$.

In the present exemplary embodiment, a supply port 10 and a collecting port 11 are provided around the final lens of the projection optical system 3 in order to form the liquid film 4 in a space between the final lens of the projection optical system 3 and the wafer 5 by supplying water. It is desirable that the space between the final lens of the projection optical system 3 and the wafer 5 is made small to the extent that the liquid film 4 can be formed and removed in a stable manner. For example, the space may be 1.0 mm.

The supply port 10 is coupled to a liquid supply device 6 through a liquid supplying line 8. The collecting port 11 is coupled to a liquid collecting device 7 through a liquid collecting line 9. The liquid supply device 6 includes a deaerating device 18 and a temperature control device 19 as its parts. The deaerating device 18 includes, for example, a publicly known membrane module (not shown) and a vacuum pump (not shown). The outer circumference of the final lens of the projection optical system 3 and the supply port 10 and the collecting port 11 is provided with light sources (irradiating light sources) 23 for controlling water repellency of a surface of the metal oxide. The liquid immersion control device 16 transmits control signals to the liquid supply device 6, the liquid collecting device 7, and the light sources 23 to control the water repellency of the surface of the metal oxide and sends/receives data to/from the stage control device 17. Thus, the liquid immersion control device 16 adjusts the supply amount and the collecting amount of water according to the movement direction or the moving speed of the wafer 5. Further, the liquid immersion control device 16 controls lighting of the light sources 23 when the edge shot is exposed. The water repellency of the surface of the metal oxide 22 is recovered when irradiating light of the light sources 23 falls onto the surface of the metal oxide (film) 22 on the liquid support plate 21 whose water repellency has deteriorated due to irradiation with the exposure light.

Figure 2B:
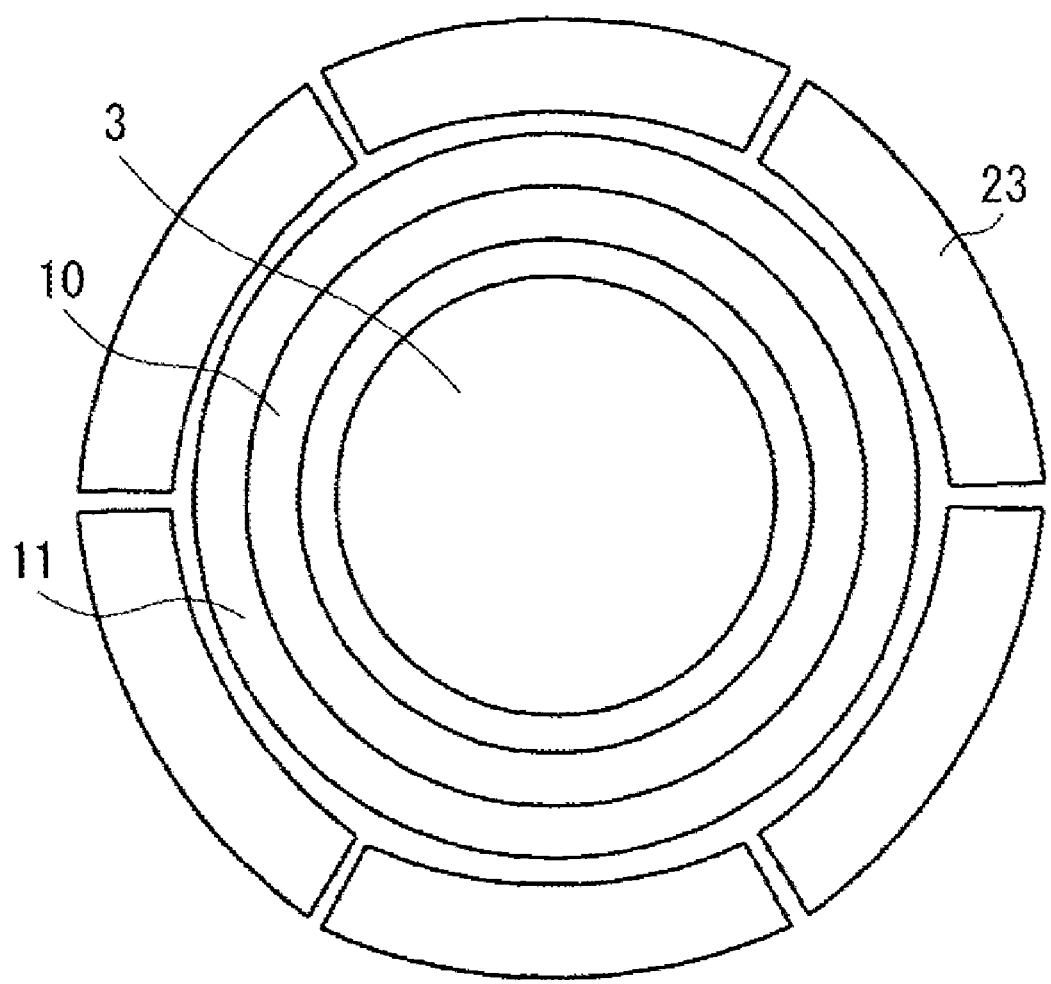
FIG. 2B illustrates a vicinity of a projection optical system of the immersion exposure apparatus when viewed from a wafer side according to the first exemplary embodiment of the present invention.

FIG. 2B illustrates an example of an arrangement of the light sources 23 which can maintain or recover the water repellency of the surface of the metal oxide 22 on the liquid support plate 21. In FIG. 2B, as the projection optical system 3 is viewed from the wafer 5 side (i.e., from the bottom), the supply port 10, the drain outlet (collecting port) 11, and the light sources 23 are arranged in an annular shape around the projection optical system 3. Further, there are six light sources 23, which are controlled by the liquid immersion control device 16 so as to turn on the light source corresponding to a portion of the liquid support plate 21 where the exposure light falls. With such a configuration of the light sources 23, only a portion requiring light irradiation can be illuminated and thus, the system can work more stably. The number of light sources 23 may be determined as required.

According to the immersion exposure apparatus having the above-described configuration, an exposure apparatus can be provided in which a droplet is prevented from remaining on the liquid support plate 21 and thus can form a highly stable and highly accurate pattern.

Second Exemplary Embodiment

Figure 3:
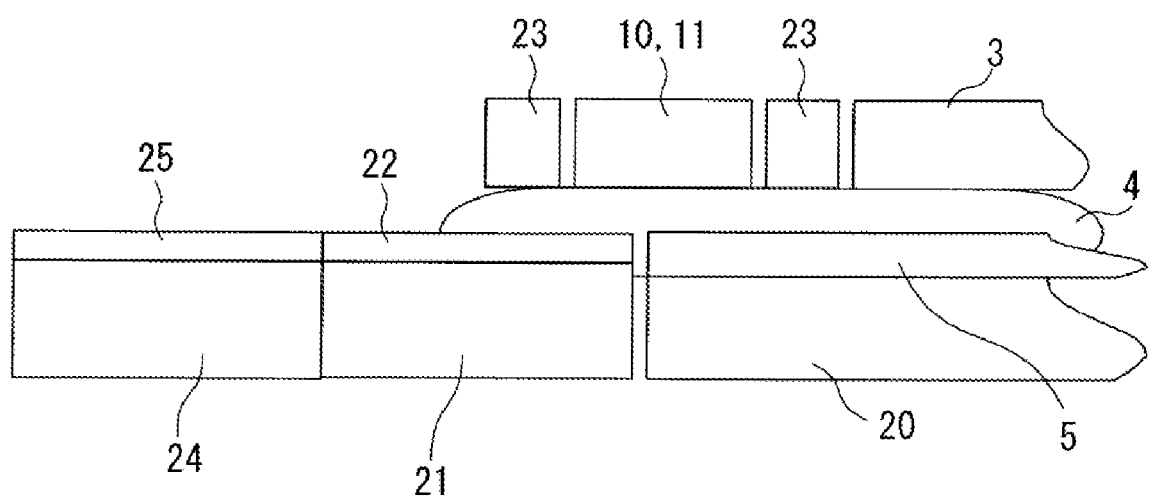
FIG. 3 illustrates a vicinity of a liquid film of an immersion exposure apparatus according to a second exemplary embodiment of the present invention.

FIG. 3 illustrates a vicinity of the liquid film 4 and a part about a half from a center of the projection optical system 3 of the immersion exposure apparatus according to a second exemplary embodiment of the present invention. In the second exemplary embodiment, there are two light sources 23 at both sides of the supply port 10 and the collecting port 11. With such an arrangement, more light can fall onto the surface of the metal oxide 22 and thus the water repellency of the metal oxide 22 can be more favorably maintained and recovered. The two irradiating light sources 23 may have a different wavelength. The optimum wavelengths may be chosen according to a combination with the metal oxide.

The second exemplary embodiment is identical to the first exemplary embodiment except that the projection optical system 3 includes two light sources 23 for allowing the surface of the metal oxide on the liquid support plate 21 to maintain or recover a function of the water repellency.

Third Exemplary Embodiment

Figure 4:
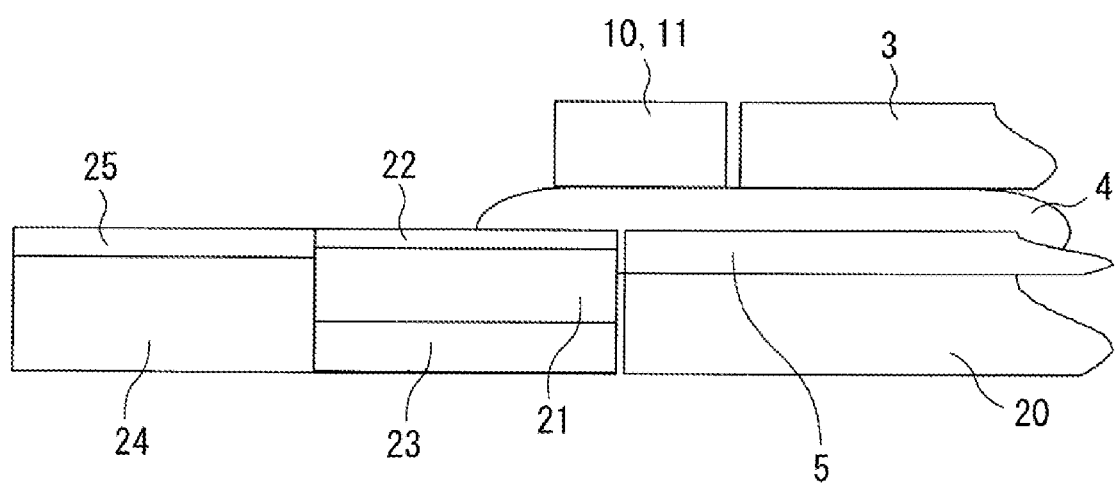
FIG. 4 illustrates a vicinity of a liquid film of the immersion exposure apparatus according to a third exemplary embodiment of the present invention.

FIG. 4 illustrates a vicinity of a liquid film 4 and apart about a half from a center of the projection optical system 3 of the immersion exposure apparatus according to a third exemplary embodiment of the present invention. The third exemplary embodiment includes light sources 23 as a liquid repellency recovery unit below the liquid support plate 21 (at the wafer stage 13 side). The liquid support plate 21 is made of a transparent base material which transmits the irradiating light emitted from the light sources 23, and the light sources 23 irradiate a reverse side of the light support plate 21 with the irradiating light. The irradiated light that is emitted from the light sources 23 and passes through the transparent base material falls further onto the metal oxide 22. Here, it is desirable that the film thickness of the metal oxide is equal to or less than 100 nm. Further, the material of the liquid support plate 21 may be any material hardly susceptible to deterioration by the wavelengths of the light sources 23 and hardly susceptible to deformation by heat, for example, ZERODUR (Shot Glass Technology Corporation) or a synthetic quartz.

The third exemplary embodiment is identical to the first exemplary embodiment except that the light sources 23 for allowing the surface of the metal oxide on the liquid support plate 21 to maintain or recover the water repellency are placed below the liquid support plate 21.

Fourth Exemplary Embodiment

Figure 5:
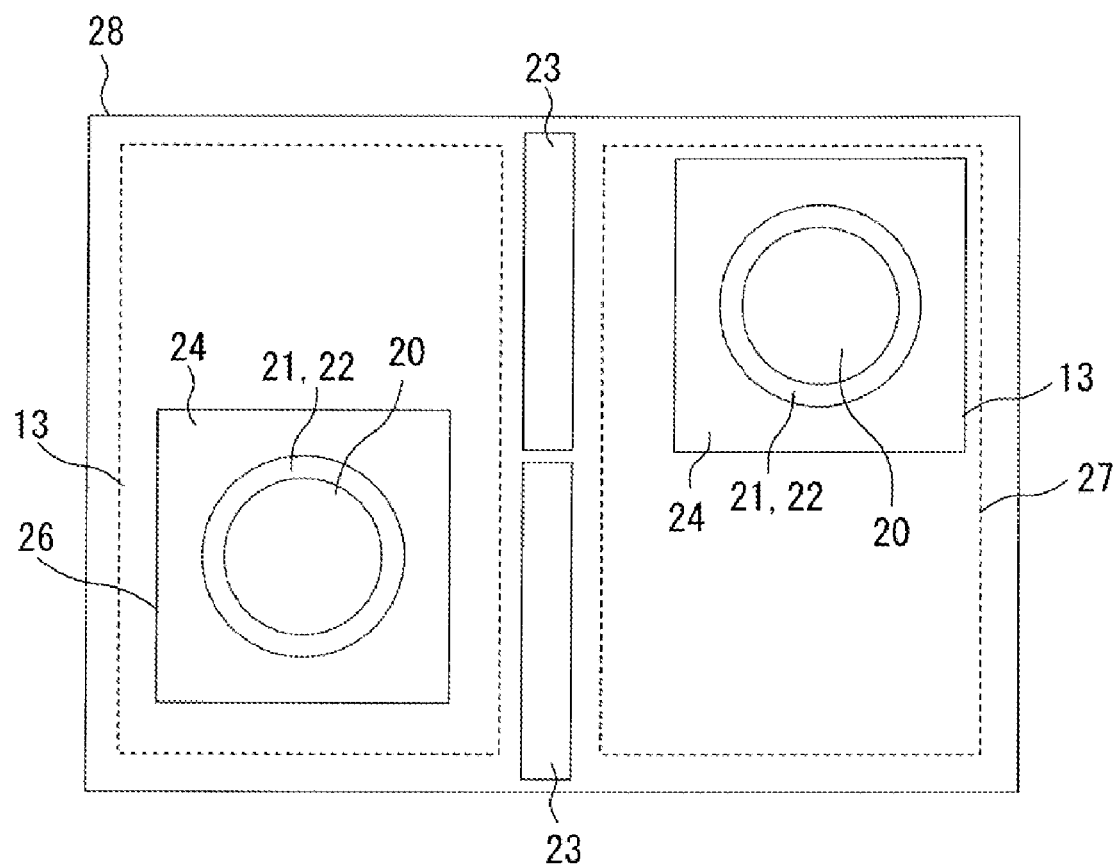
FIG. 5 illustrates a vicinity of a stage of an immersion exposure apparatus when viewed from a projection optical system side according to a fourth exemplary embodiment of the present invention.

FIG. 5 illustrates wafer stages of an immersion exposure apparatus according to a fourth exemplary embodiment of the present invention. The immersion exposure apparatus according to the fourth exemplary embodiment is a twin-stage type exposure apparatus having two wafer stages 13 on a stage surface plate 28. The stage surface plate 28 includes an exposure station 26 on which one wafer stage 13 is provided in order to expose the wafer 5 to light and a measurement station 27 on which the other wafer stage 13 is provided in order to measure positions of shots of the wafer 5.

In the fourth exemplary embodiment, as an example, the light sources 23 as the liquid repellency recovery unit are provided in a space between the exposure station 26 and the measurement station 27.

The light sources 23 are turned on when the two wafer stages 13 move from the exposure station 26 to the measurement station 27 or move from the measurement station 27 to the exposure station 26. The light sources 23 thereby irradiate the metal oxide 22 on the liquid support plate 21.

The light sources 23 may also be provided on the measurement station 27.

Further, a air blower that will be described below may be provided in a space between the exposure station 26 and the measurement station 27 as the water repellency (liquid repellency) recovery unit, or may be provided on one of the stations.

Fifth Exemplary Embodiment

Figure 6:
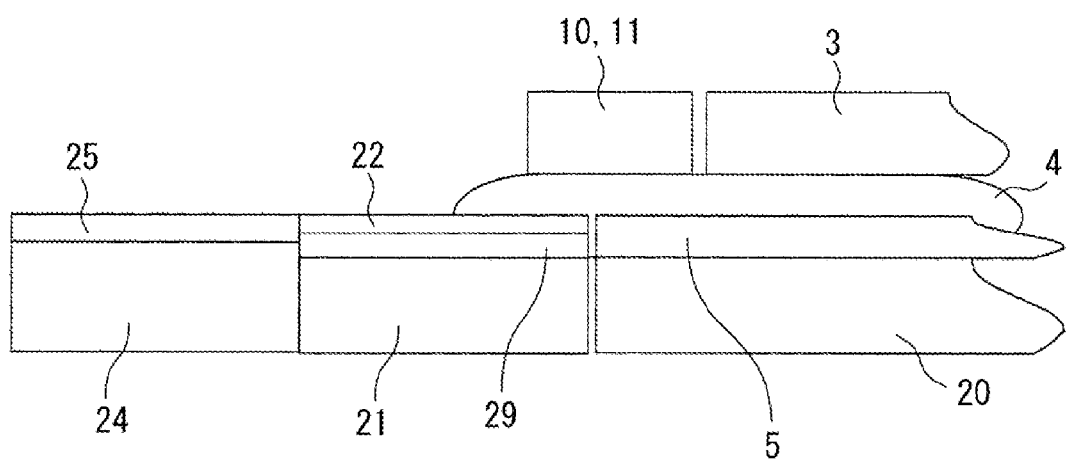
FIG. 6 illustrates a vicinity of a liquid film of an immersion exposure apparatus according to a fifth exemplary embodiment of the present invention.

FIG. 6 illustrates a vicinity of a liquid film 4 and apart about a half from a center of the projection optical system 3 of the immersion exposure apparatus according to a fifth exemplary embodiment of the present invention. The fifth exemplary embodiment uses, as the liquid repellency recovery unit, heat sources 29 instead of the light sources. In the fifth exemplary embodiment, the heat sources 29 are placed above the liquid support plate 21 and immediately below the metal oxide 22 to heat the metal oxide 22 by the heat sources 29 and thus the water repellent function of the metal oxide 22 can be recovered and maintained. Since the heat from the heat sources 29 is directly transmitted to the metal oxide 22, less amount of heat is required for water repellency recovery.

The heat sources 29 may be thin-film shaped heaters, which may be manufactured, for example, by a thin-film resistor formation method using a semiconductor process. This is because thin-film shaped heaters can be manufactured to be uniform, thin, and flat according to the above-described method.

The fifth exemplary embodiment is identical to the first exemplary embodiment except that the heat sources 29 are used as the liquid repellency recovery unit instead of the light sources 23.

Sixth Exemplary Embodiment

Figure 7:
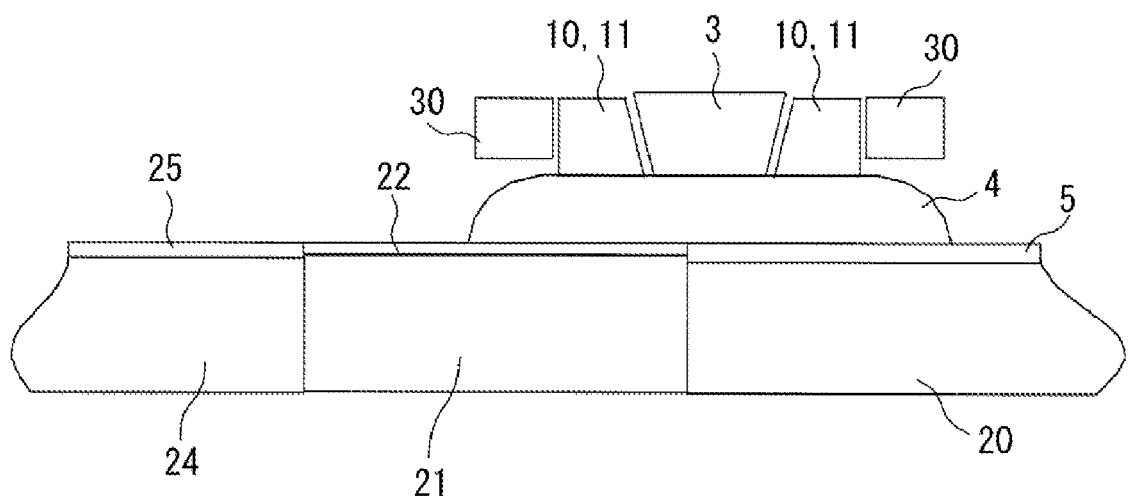
FIG. 7 illustrates a vicinity of a liquid film of an immersion exposure apparatus according to a sixth exemplary embodiment of the present invention.

FIG. 7 illustrates a vicinity of the liquid film 4 of an immersion exposure apparatus according to a sixth exemplary embodiment. The sixth exemplary embodiment utilizes air blowers 30 as the liquid repellency recovery unit instead of the light sources or the heat sources.

In the sixth exemplary embodiment, the air blowers 30 are placed along the outer circumference of the supply port 10 and the collecting port 11. The air blowers 30 blow inert gas such as dried clean air or nitrogen onto the metal oxide 22 to recover and maintain the water repellent function of the metal oxide 22. The air blowers 30 are configured, for example, of rows of minute ports. With such a configuration, the water repellency of the surface of the metal oxide 22 can be recovered efficiently since a high flow rate can be obtained with a small flow volume.

The sixth exemplary embodiment is identical to the first exemplary embodiment except that the air blowers 30 are used as the liquid repellency recovery unit instead of the light sources.

In each of the exemplary embodiments, the liquid support plate 21 including the surface of the metal oxide is provided around the wafer 5. However, the surface of the wafer stage 13 is typically provided with a reference mark plate including a reference mark formed thereon or an illuminance meter. Therefore, the liquid support plate including the surface of the metal oxide may also be provided around the reference mark plate or the illuminance meter to enable any one of the above-described liquid repellency recovery units (light sources, heat sources, or air blowers) to recover the liquid repellency of the surface of the metal oxide.

Embodiment of Device Manufacturing Method

A device (e.g., a semiconductor integrated circuit device or liquid crystal display device) is manufactured by an exposure step of exposing a substrate (e.g., a wafer or glass plate) coated with a photosensitive agent using the immersion exposure apparatus according to the above-described embodiment, a development step of developing the photosensitive agent, and other known steps.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-168525 filed Jun. 27, 2007, which is hereby incorporated by reference herein in its entirety.

What is claimed is:

1. An immersion exposure apparatus for exposing a substrate through a liquid comprising:
    an illumination optical system configured to illuminate an original with exposure light from an exposure light source;
    a projection optical system configured to project a pattern of the original onto the substrate;
    a chuck configured to hold the substrate;
    a liquid support plate configured to support the liquid together with the substrate held by the chuck, a surface of the liquid support plate including a surface of a metal oxide;
    a movable stage including the chuck and the liquid support plate; and
    a liquid repellency recovery unit configured to recover a liquid repellency of the surface of the metal oxide with respect to the liquid,
    wherein a metal oxide film is formed on a surface of the liquid support plate and a surface of the metal oxide is a surface of the metal oxide film, wherein the liquid support plate includes a transparent base material that transmits an irradiating light and the metal oxide film is formed on a surface of the transparent base material; and wherein the liquid repellency recovery unit illuminates the metal oxide film with the irradiating light through the transparent base material.

2. The immersion exposure apparatus according to claim 1, wherein the liquid repellency recovery unit includes a blower for blowing air to a surface of the metal oxide.

3. The immersion exposure apparatus according to claim 1, wherein the liquid repellency recovery unit includes a heater for heating the metal oxide.

4. The immersion exposure apparatus according to claim 1, wherein the metal oxide includes at least one of $TiO_2$, ZnO, $Cr_2O_3$, $HfO_2$, and $WO_3$.

5. The immersion exposure apparatus according to claim 1, further comprising:

an exposure station on which the stage is provided in order to expose the substrate to light; and a measurement station on which the stage is provided in order to measure positions of shot regions of the substrate;

wherein the liquid repellency recovery unit is provided on the measurement station or between the measurement station and the exposure station.

* * * * *